United States Patent
Anand et al.

(10) Patent No.: US 7,444,564 B2
(45) Date of Patent: Oct. 28, 2008

(54) AUTOMATIC BIT FAIL MAPPING FOR EMBEDDED MEMORIES WITH CLOCK MULTIPLIERS

(75) Inventors: Darren L. Anand, Essex Junction, VT (US); Kevin W. Gorman, Milton, VT (US); Michael R. Nelms, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 767 days.

(21) Appl. No.: 10/707,071

(22) Filed: Nov. 19, 2003

(65) Prior Publication Data

US 2005/0120270 A1    Jun. 2, 2005

(51) Int. Cl.
  *G11C 29/00* (2006.01)
  *G01R 31/28* (2006.01)
(52) U.S. Cl. .................. 714/723; 714/733
(58) Field of Classification Search ................ 714/733, 714/723
  See application file for complete search history.

(56) References Cited

U.S. PATENT DOCUMENTS

| | | | |
|---|---|---|---|
| 4,876,685 A | | 10/1989 | Rich |
| 5,912,901 A | * | 6/1999 | Adams et al. ............... 714/733 |
| 5,936,876 A | | 8/1999 | Sugasawara |
| 5,961,653 A | * | 10/1999 | Kalter et al. ................. 714/7 |
| 6,185,709 B1 | | 2/2001 | Dreibelbis et al. |
| 6,255,836 B1 | | 7/2001 | Schwarz et al. |
| 6,496,947 B1 | * | 12/2002 | Schwarz ...................... 714/30 |
| 6,509,766 B1 | | 1/2003 | Pomichter et al. |
| 6,643,807 B1 | * | 11/2003 | Heaslip et al. .............. 714/719 |
| 6,978,402 B2 | * | 12/2005 | Hirabayashi ................ 714/42 |
| 2003/0084387 A1 | | 5/2003 | Rooney et al. |
| 2005/0047229 A1 | * | 3/2005 | Nadeau-Dostie et al. .... 365/201 |

FOREIGN PATENT DOCUMENTS

| | | |
|---|---|---|
| JP | 7078495 | 3/1995 |
| JP | 2002243801 | 8/2002 |
| JP | 2002298598 A | 10/2002 |
| JP | 2002-298598 A | 11/2002 |

OTHER PUBLICATIONS

International Test Conference, 1998 Proceedings, "Semiconductor Manufacturing Process Monitoring using Built-In Self-Test for Embedded Memories", Ivo Schanstra, Dharmajaya Lukita, Ad J. van de Goor, Kees Veelenturf, Paul J. van Winjnen, pp. 872-881.

* cited by examiner

*Primary Examiner*—James C Kerveros
(74) *Attorney, Agent, or Firm*—Scully, Scott, Murphy & Presser, P.C.; Michael J. LeStrange, Esq.

(57) ABSTRACT

A bit fail map circuit accurately generates a bit fail map of an embedded memory such as a DRAM by utilizing a high speed multiplied clock generated from a low-speed Automated Test Equipment (ATE) tester. The circuit communicates between the ATE tester, the embedded memory under test, Built-In Self-Test (BIST) and Built-In Redundancy Analysis (BIRA). An accurate bit fail map of an embedded DRAM memory is provided by pausing the BIST test circuitry at a point when a fail is encountered, namely a mismatch between BIST expected data and the actual data read from the array, and then shifting the bit fail data off the chip using the low-speed ATE tester clock. Thereafter, the high-speed test is resumed from point of fail by again running the BIST using the high-speed internal clock, to provide at-speed bit Fail Maps.

12 Claims, 8 Drawing Sheets

AUTOMATIC BIT FAIL MAPPING FOR EMBEDDED MEMORIES WITH CLOCK MULTIPLIERS

BACKGROUND OF INVENTION

1. Field of the Invention

The present invention relates generally to automatic bit fail mapping for embedded memories with clock multipliers, and more particularly pertains to automatic bit fail mapping for embedded DRAMs (Dynamic Random Access Memories) with clock multipliers.

More specifically, a system and method are provided of automatic bit fail mapping of embedded memories such as DRAM arrays on a chip while using a low-speed, off-chip ATE (Automatic Test Equipment) tester. BIST (Built In Self Test) test circuitry on the chip is run from an internal high-speed clock that is a multiplied frequency of the low-speed ATE tester clock. An accurate bit fail map of an embedded DRAM memory is provided by stopping the BIST test circuitry at a point when a fail is encountered, namely a mismatch between BIST expected data and the actual data read from the array, and then shifting the bit fail data off the chip using the low-speed ATE tester clock. Thereafter, the high-speed test is resumed by again running the BIST using the high-speed internal clock, to provide at-speed bit Fail Maps.

As embedded memory sizes continue to increase, overall BIST (Built In Self Test) testing time will also increase; hence, novel schemes that reduce test time while maintaining test integrity and diagnostic resolution are of great value. One current issue is that the ATE (Automated Test Equipment) tester, and specifically the ATE tester clock, is not fast enough to accommodate BIST testing. This can be addressed by having the BIST run off an internal clock that is a multiplied frequency of the ATE tester clock. However, the ability to accurately bit fail map a memory that is tested by an internal multiplied clock is inhibited by the inability to stop the test circuitry at the exact point when a fail is encountered, shift out the fail data, and then resume the test successfully.

2. Discussion of the Prior Art

ASIC (Application Specific Integrated Circuit) designs and SoC (System on a Chip) designs are being produced with ever increasing amounts of embedded DRAM memory. Tighter geometries have a greater effect on memory defect concentrations than in the surrounding logic. Decreasing process geometries increase the susceptibility to delay faults of all circuits, increasing the importance of at-speed testing. Automated Test Equipment (ATE) that can keep pace with on-chip clock speeds is becoming prohibitively expensive, rendering the capital investment necessary to provide at-speed test results undesirable.

The use of Built-In Self-Test (BIST) helps to alleviate the capital cost of high performance ATE, however at the expense of silicon overhead. Until recently, using BIST still implied that the clock speed of the BIST on the chip equated to the clock speed provided by the ATE tester. On chip clock frequency multiplication (PLL's, DLL's, etc.) enables at-speed BIST testing with a low cost, low-speed tester. On-chip memories can thus be tested at-speed with a low-speed ATE tester.

Generating pass/fail results using BIST with a multiplied clock is relatively straightforward, as is using a Built-In Redundancy Analyzer (BIRA) because the redundancy information never needs to come off the chip. Extracting the array Fail Map information off the chip requires that the tester be in sync with the memory under test. Up to now, generating a Fail Map with a low-speed ATE tester required low-speed BIST execution, because frequency domain changes between the ATE tester and the BIST test circuitry on the chip do not allow proper data collection.

Fail Maps are an essential tool to understand defects and improve yield. Thus, the capability to generate Fail Maps of embedded memory arrays is essential to the success of an embedded memory program, especially as increasingly more memory is being placed on a chip.

The capability to provide a Fail Map via BIST is much different than the traditional method of interfacing directly with the memory pins. On many SoC designs, the ATE tester often has no direct access to the memory and thus must rely solely on BIST for pass/fail results and any other, more detailed, diagnostics. Providing a means to identify all failing elements is necessary. Built-In Redundancy Analysis (BIRA) identifies which elements are failing and determines the optimal redundancy solution for memories with redundancy. The logic that supports BIRA can also be used to provide Fail Map data with minimal additional silicon cost.

Generating a Fail Map typically requires the BIST to run to a fail, at which point the tester suspends the test on the fail. The Fail Map data is then shifted out to the tester in "data slices" and the Fail Map slices are assembled and recreated in software. This method is acceptable for detecting stuck-at faults, the most common type of fault, and also works well for detecting speed related faults or delay faults, if the tester is capable of providing accurate clocks at a high enough frequency. As increases in on-chip clock frequency outpace the increases in ATE clock frequency, the capability to Fail Map an array at-speed becomes more difficult without large capital expenditures

SUMMARY OF INVENTION

The present invention provides a system and method of automatic bit fail mapping of embedded memories such as DRAM arrays on a chip while using a low-speed, off-chip ATE tester by running BIST test circuitry on the chip from an internal high-speed clock that is a multiplied frequency of the low-speed ATE tester clock. The ability to accurately bit fail map an embedded DRAM memory is provided by stopping the BIST test circuitry at a point when a fail is encountered, namely a mismatch between BIST expected data and the actual data read from the array, shifting the bit fail data off the chip using the low-speed ATE tester clock, and then resuming the test by again running the BIST using the high-speed internal clock, to provide at-speed bit Fail Maps.

BRIEF DESCRIPTION OF DRAWINGS

The foregoing objects and advantages of the present invention for automatic bit fail mapping for embedded memories with clock multipliers may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION

The present invention provides a methodology and a circuit wherein a BIST test engine is run off an internal multiplied clock until the occurrence of a fail, at which time the BIST and related test circuitry are paused until an ATE test acknowledgement automatically switches the BIST test circuitry to the ATE tester clock to guarantee that all bit fail location information shift out operations are synchronized between the ATE tester and the embedded test circuitry.

During test, the embedded memory is run off an internal multiplied clock that can be out of phase from the tester supplied ATE clock. The circuit and methodology of the present invention provide for accurate bit fail mapping, irrespective of the internal clock phase and multiplication factor.

The ATE tester is only required to produce a free running oscillating clock which is multiplied, and a BIST engine running off the multiplied clock stimulates the memory. As soon as a fail occurs, namely a mismatch between BIST expected data and the actual data read from the array, the circuit pauses the BIST. This pause prevents the BIST from getting out of sync with the tester. The exact location of the fail is already stored in latches by the time the fail is recognized. The same logic that pauses the BIST also degates the clock to the fail location registers, allowing the information to be shifted off the chip to the ATE tester.

If necessary, the ATE tester can provide a pulse that controls when the actual shift-out of the fail information occurs after the internal pause, in order to re-synchronize the fail information with the tester data capture memory. To further guarantee that all shift operations are correctly synchronized, the internal circuitry automatically switches to operate off the ATE tester clock domain when a fail is discovered.

On chip clock frequency multiplication enables at-speed test with a low-speed ATE tester. Multiplying the input (tester) clock frequency allows the chip to be BIST tested at the full rated frequency without the cost of providing a high speed tester, nor the IO real estate required to have direct memory access. Running a BIST pass/fail with a multiplied clock is straightforward: Provide the number of cycles required to complete the BIST sequence, and at the end of the BIST sequence observe a diagnostic pin to determine if the chip passed the test. However, using the described method to try to generate a Fail Map does not work. When the chip clock and the tester clock are at the same frequency, the feedback from the chip allows the tester to generate an accurate Fail Map because they are always in lockstep. With a multiplied clock, since the chip clock and the test clock are at different frequencies, the direct feedback that the tester requires to provide accurate address and data bit correspondence is lost.

The present invention provides a Fail Map circuit that enables the accurate collection of Fail Map data from BIST using at-speed chip clocks produced with a low-speed tester clock. The circuit provides the capability to generate at-speed fail maps with a low speed tester by 1) executing the BIST sequence with the multiplied clock during Fail Mapping, 2) preventing the BIST and associated memories from advancing when a fail is detected during Fail Mapping, 3) generating an output signal for the tester to identify that a fail has occurred. 4) providing an interface to collect the Fail Map data, and 5) resuming at-speed test after collection of Fail Map data is complete.

Architecture

Figure 1:
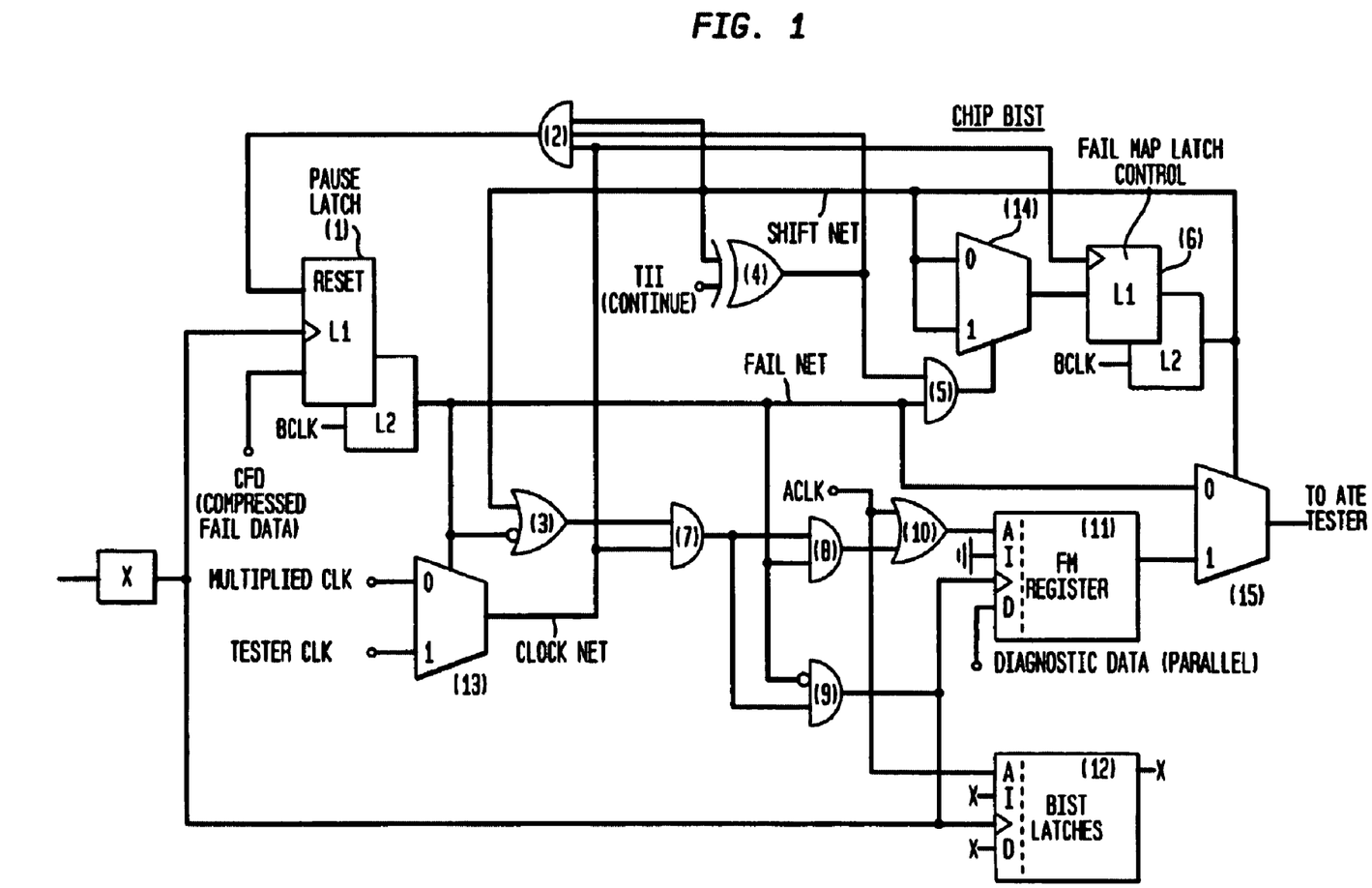
FIG. 1 is a circuit block diagram and schematic of the Fail Map circuitry that provides the basic logical description of the implementation of the system and method of the present invention.

FIG. 1 is a circuit block diagram and schematic of the Fail Map circuitry that provides the basic logical description of the implementation of the system and method of the present invention. The exemplary Fail Map circuit includes fifteen circuit elements, most of which are required for basic functionality of the memory and/or for generating a Fail Map directly. The system includes two control latches 1, 6 and an FM register/latch 11 which contains all the bit-fail map data.

Latches 1 and 6 and the latches in registers 11 and 12 (which include a plurality of latches) all include both (1) L1 master latches, which are clocked with functional data with a functional clock CCLK or with scan data with a scan clock ACLK, and (2) L2 slave latches which are updated with L1 data with a slave latch clock BCLK. Latches 1 and 6 schematically illustrate the master and slave latches, while registers 11 and 12 imply both master and slave latches.

The ACLK input is the scan clock for all LSSD (Level Sensitive Scan Design) L1 (master) latches on the chip. The BCLK signal is required for updating all the L2 (slave) latches, and is implied in all of the circuits. The disclosed embodiment uses an LSSD scan design, while alternative embodiments can implement other types of scan designs such as a MUX scan design.

All latches have a serial input ("I"), shown for latches/registers 11 and 12, which is wired in series to form scan chains. Using non-overlapping ACLK/BCLK pulses while driving values into the scan chains initializes the contents of the latches to certain values (scan-in operation) before test. The same non-overlapping ACLK/BCLK pulses can be used to unload the scan chains for observation at the end of testing (scan-out operation). Scan operations corrupt the value of all latches on the chip and thus a test must be reinitialized if a scan out is performed.

The CLK (Clock Net) output from MUX (multiplexer) 13 is an input to the latches/registers which generates non-overlapping CCLK/BCLK pulses internal to the latches. CCLK is the functional clock input to the L1 latch. Thus a single ended clock is used to update all functional L1 and L2 latches. During Fail-Map shift out, steering logic forces the CCLK to be ORed by OR gate 10 with ACLK while the BCLK updates normally. This enables shifting out the Fail-Map data with only one clock through a different clock path.

Figure 5:
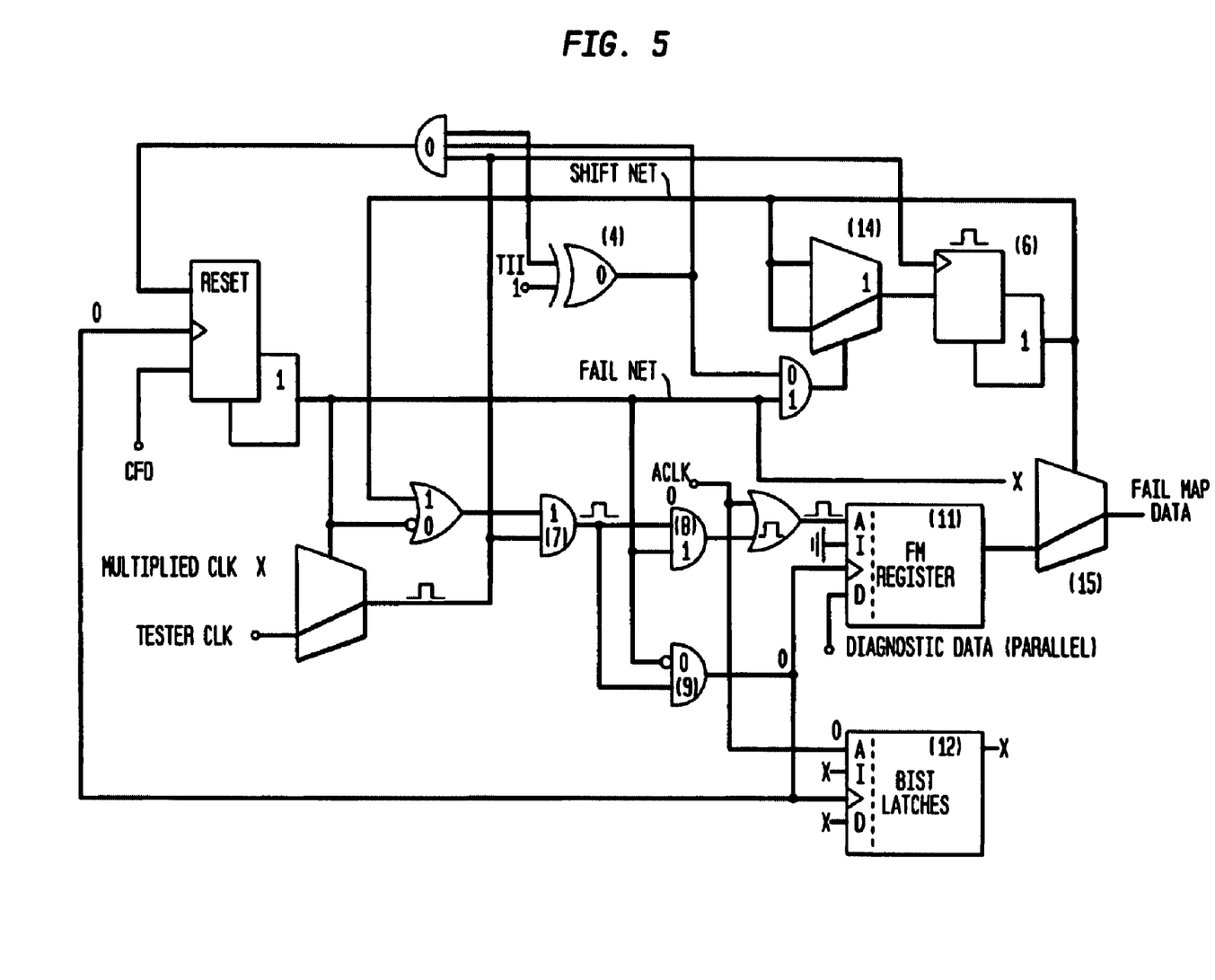
FIG. 5 illustrates the state of the Fail Map circuit after Shift Net is asserted (TII is still asserted).

The Tester clock input to MUX (13) is the input clock directly from the ATE tester. The Multiplied clock input is a frequency multiplied version of the tester clock that is preferably generated by an on-chip multiplier X which receives an input from the Tester CLK. The Tester Interface Input (TII) is an input signal from the ATE tester to coordinate the Fail Map collection. Fail Map data collected when the Fail Map state machine of FIG. 1 is in the functional clock off state and TII is "1" (FIG. 5). The output of MUX (15) is connected to the ATE tester, providing all diagnostic information from the chip.

A Compressed Fail Data (CFD) signal is generated by the BIST comparator, and is the result of comparing a plurality of data bits from the memory array at the output of MUX 15 with expected values generated by the BIST data generator, with the final result being compressed to one bit.

Register (11) is the Fail Map Register containing all diagnostic latches for generation of Fail Maps. Register (12) contains all other latches within the BIST and the memories for which latch operation can be suspended on a fail.

Register 11 is connected to have a shift clock ORed by OR gate 10 with the regular scan clock ACLK. Thus the Fail Map data can be extracted from the register 11 without disturbing any functional latches or the state of the BIST.

Operation

Figure 2:
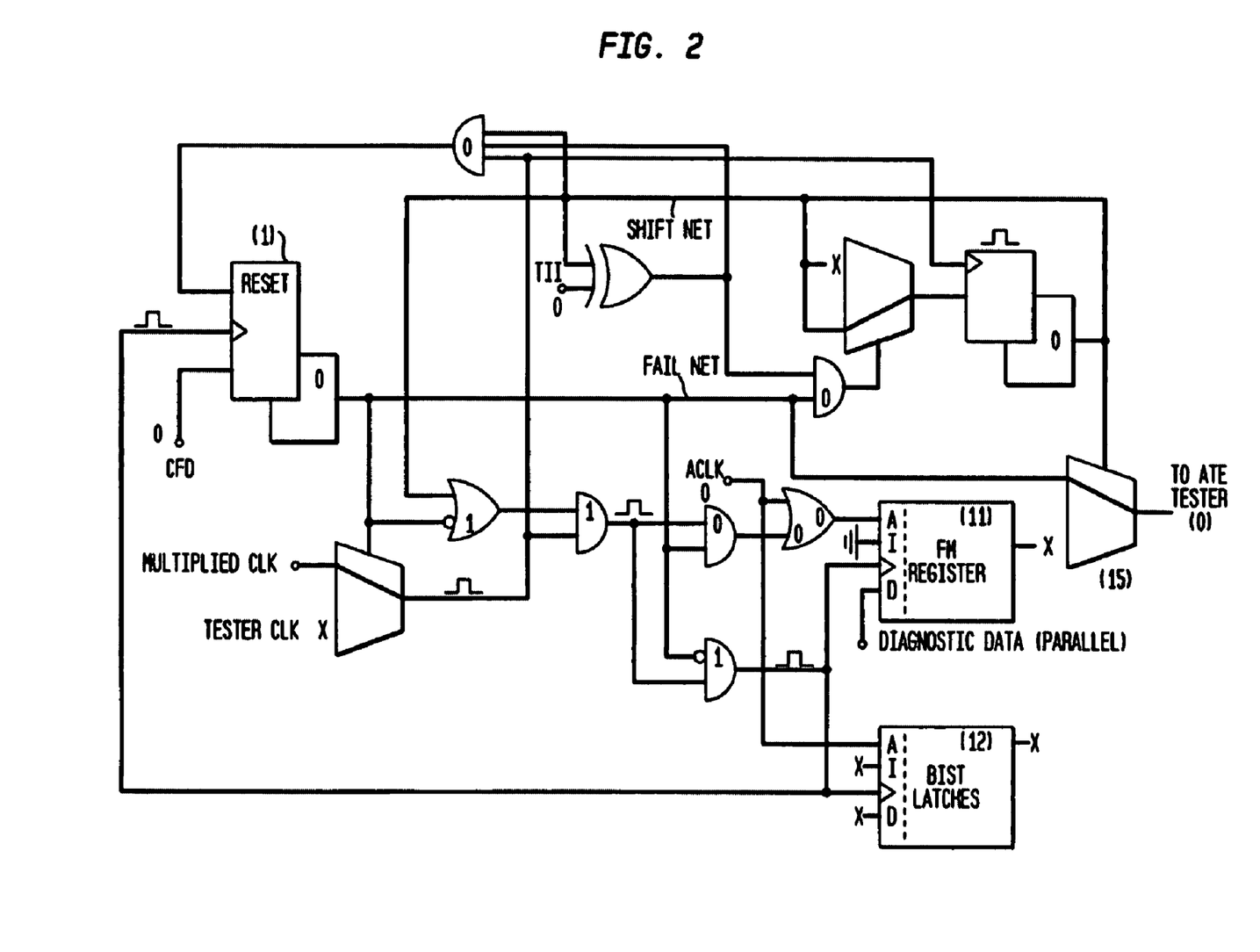
FIG. 2 shows the configuration of the circuit and the values of each net during Fail Mapping when no fails have yet occurred, and also shows the passage of signals through the MUXes.

FIG. 2 shows the configuration of the circuit and the values of each net during Fail Mapping when no fails have yet occurred, and also shows the passage of signals through the MUXes 13, 14 and 15. The Multiplied CLK is distributed through MUX 13 to all latches in the BIST and memories, while the ATE tester is polling the output of MUX (15). When at least one fail is generated, the CFD signal is asserted by the BIST comparator, and is captured by Latch (1) on the next multiplied clock cycle, and Latch 1 then asserts a Fail Net signal, resulting in a configuration as shown in FIG. 3.

Figure 3:
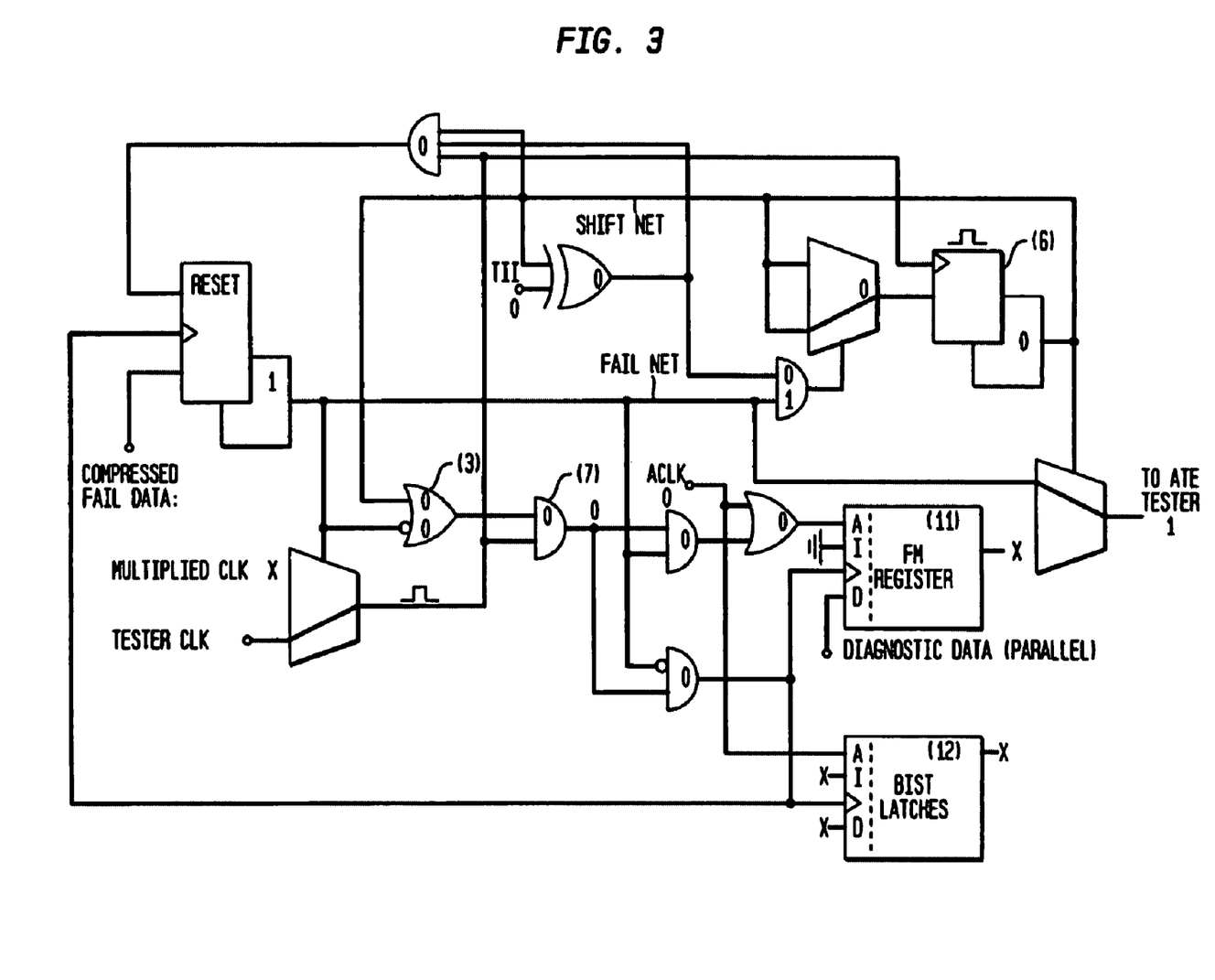
FIG. 3 shows the configuration of the circuit and the values of each net after a fail has been detected by the BIST test circuitry, and also shows the passage of signals through the MUXes.

FIG. 3 shows the configuration of the circuit and the values of each net after a fail has been detected by the BIST comparator, and also shows the passage of signals through the MUXes 13, 14 and 15. The asserted Fail Net signal automatically switches the MUX 13 to switch Clock Net from the Multiplied clock to the Tester clock. Both inputs to OR (3) are low which gates off the clock pulses in AND (7), preventing clock propagation to all latches with the exception of the Fail Map control latch (6). The output of MUX 15 to the ATE tester is now a 1 indicating a fail has occurred. When the clocks are gated off, the BIST is effectively suspended and waits for the ATE tester to signal it is ready for the shift out of fail map data by asserting the TII signal to indicate that the ATE tester is ready to collect Fail Map data.

Figure 4:
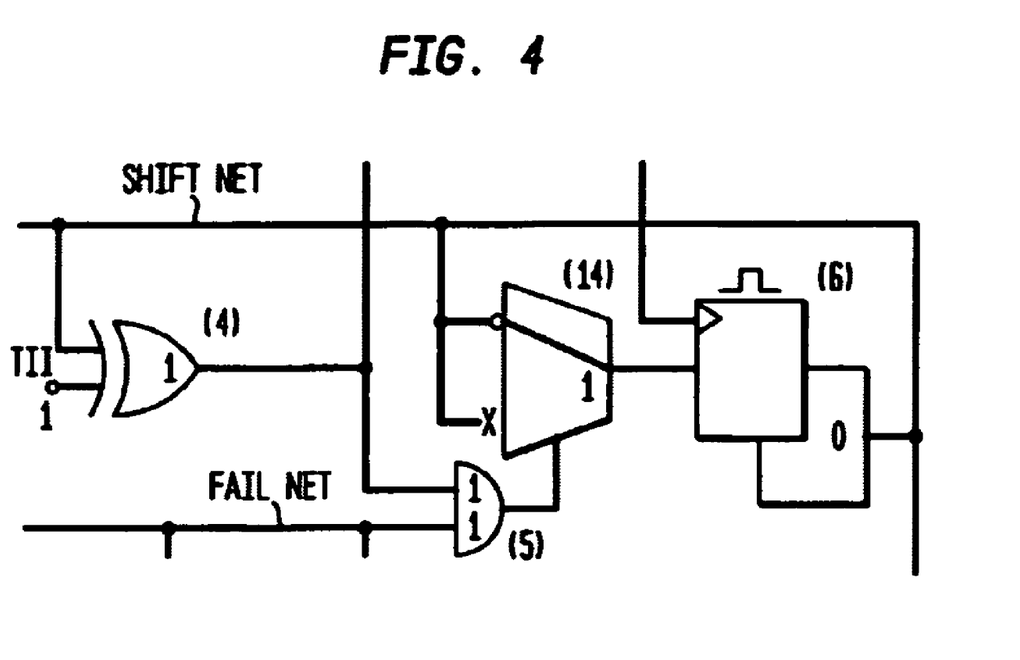
FIG. 4 illustrates the state of the circuit after the ATE tester asserts the Tester Interface Input (TII) signal to coordinate Fail Map data collection.

FIG. 4 illustrates the state of the circuit after the ATE tester asserts the Tester Interface Input (TII) signal to coordinate Fail Map data collection. The output of XOR (4) is now asserted, selecting the inverting input to MUX (14). This asserts the input to latch (6), enabling latch (6) to assert Shift Net on the next tester cycle. No other latches can update because their clocks are gated off. An alternative embodiment could remove XOR 4 and connect the TII signal to AND 5, and instead of using one long pulse on TII to identify the shift sequence, use one short pulse at the beginning and one short pulse at the end.

FIG. 5 illustrates the state of the Fail Map circuit after Shift Net is asserted (TII is still asserted). The MUX (15) now selects the Fail Map register 11 as its input instead of the Fail Net signal. The output of XOR (4) is cleared, switching MUX (14) to the noninverting input, and preserving the value in Latch (6) until TII is cleared. Asserting Shift Net enables the clocks to propagate through AND (7). The functional clocks are gated by AND (9), however the Shift Clocks propagate from AND (8) to the Fail Map register (11). This enables the ATE tester to shift out and collect the Fail Map data from the register 11 without disturbing the state of the BIST or the memory.

Figure 6:
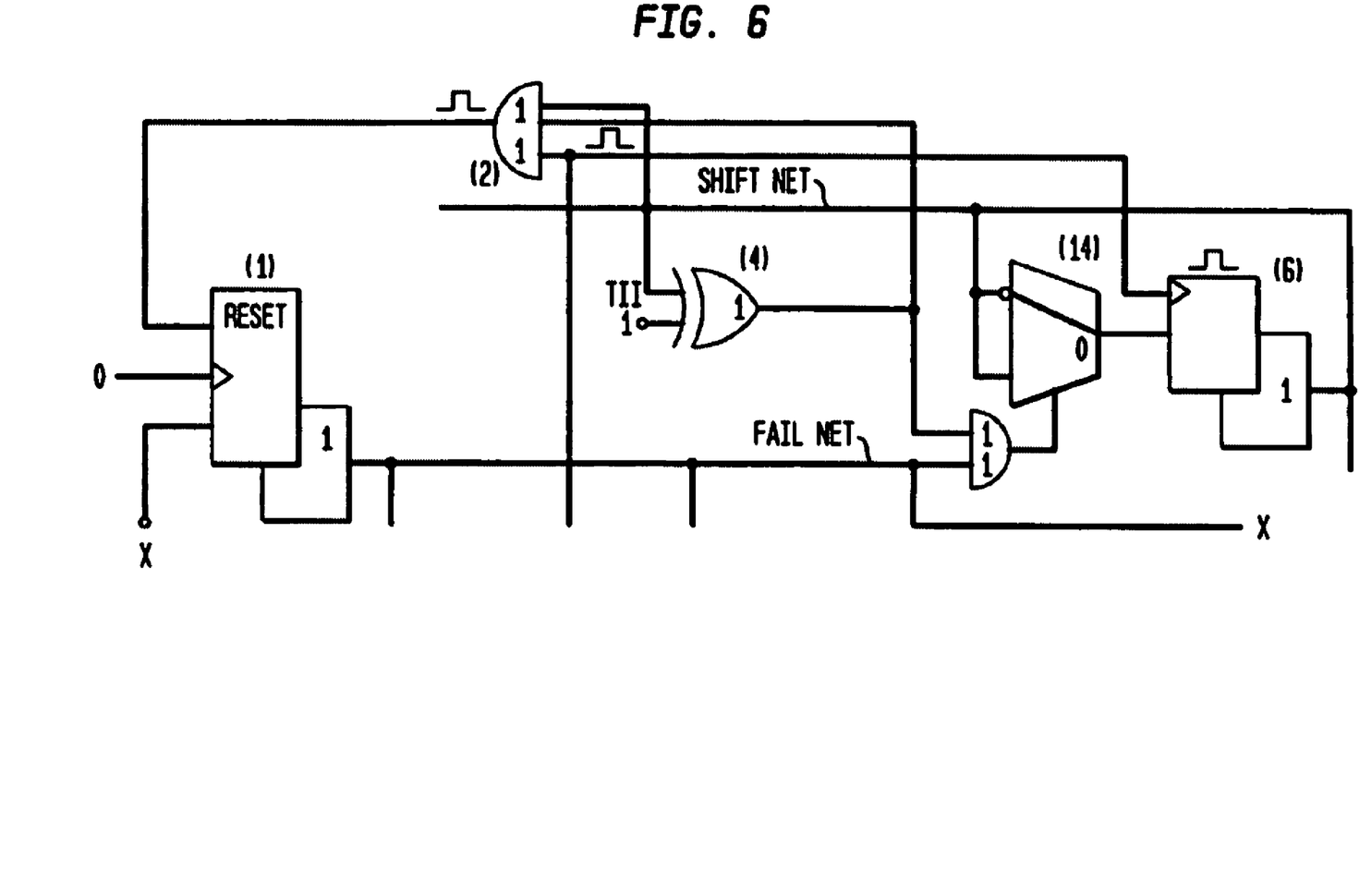
FIG. 6 illustrates the state of the circuit after TII is cleared to indicate that the ATE tester has finished collecting the Fail Map data and is ready to resume the test.

FIG. 6 illustrates the state of the circuit after TII is cleared to indicate that the ATE tester has finished collecting the Fail Map data and is ready to resume the test. The output of XOR (4) is asserted which selects the inverting leg of MUX (14) to reset Latch (6) on the next cycle, and also enables the Reset port of Latch (1) via AND (2). The Multiplied clock has continued oscillating at full speed during Fail Map collection, and the circuit and MUX 13 merely steer the desired clock onto Clock Net. On the next ATE Tester cycle, Latch (1) and Latch (6) update, resetting the system to the state of FIG. 2.

The Fail Map circuit enables the generation of at-speed Fail Maps with a low speed external ATE tester, by the using existing BIST and BIRA circuitry, and handshaking with the external ATE tester. A key characteristic of the Bit Map circuit is that it automatically pauses the BIST during at-speed testing and transfers control to the ATE tester which is running at a lower clock frequency. The ATE tester then collects accurate Fail Map data at the slower frequency. When the data collection is complete, the system resumes the BIST test from the exact point at which execution was suspended.

If a test must be restarted from the beginning for some reason (i.e. the data retention spec for an embedded DRAM is exceeded by multiple Fail Map shift outs), previously encountered fails can be skipped by holding the TII high for only one cycle after the tester output pin is asserted. This resets the state machine to execute the BIST sequence from the exact point the fail is detected.

A secondary attribute of the Fail Map circuit is its simple sophistication. A similar system can be implemented with flip-flops if MUX scan is available. Those skilled in the art can implement a design using MUX scan or any other design for test methodology. Also, the circuit can be implemented with any LSSD system without requiring additional BIST pins since the TII can also control the BIST independently and the output net can be muxed with existing scan lines. The only ATE requirements are a clock frequency compatible with the on chip clock multiplier and enough IO pins (clock, TII, Scan Ins, Scan Outs, Observation Pin) to support BIST.

With a minimum silicon overhead, an embedded memory test pursuant to the present invention, that uses clock frequency multiplication, BIST and BIRA, can also be used to generate at-speed array Fail Maps. At-speed Fail Maps incorporate the level of delay fault detection and diagnosability that is required with present day shrinking geometries. Though including at-speed test improves test quality, this improvement generally comes at the expense of purchasing a high performance ATE tester. Enabling the BIST to generate at-speed Fail Maps with a low speed ATE tester contains ATE cost while maintaining the quality of test. The Fail Map circuit thus minimizes test overhead and maximizes diagnosability in an effort to understand defects and improve yield with no new capital investment.

The operation of the Fail Map circuit is described below with illustrative waveforms for both a single and consecutive fails.

Figure 7:
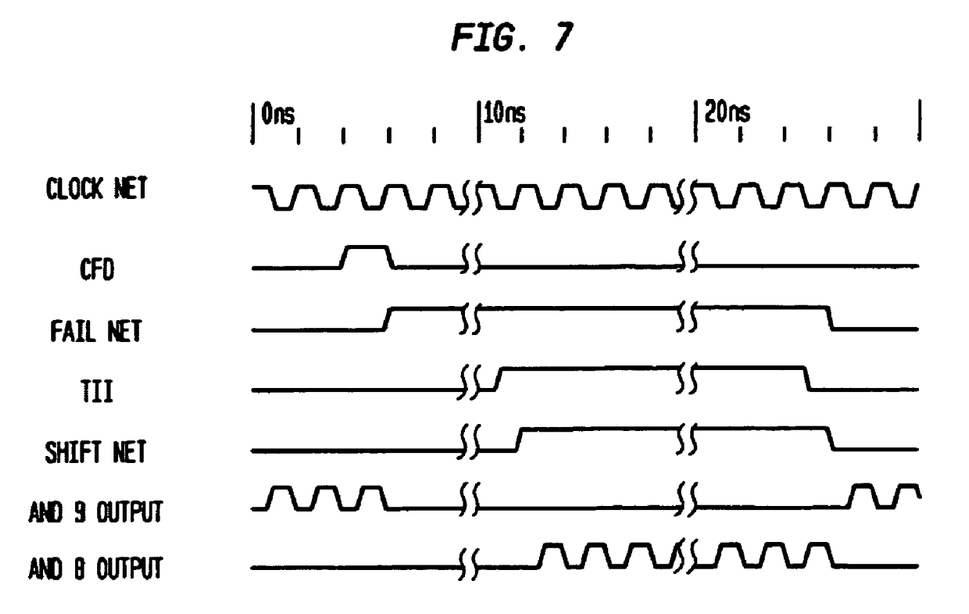
FIG. 7 illustrates waveforms that describe the operation of the Fail Map circuit with a single fail.

FIG. 7 illustrates waveforms that describe the operation of the Fail Map circuit with a single fail.

The BIST comparator asserts the CFD signal when the data out from the array being tested is not equal to the expected data generated by the BIST.

The Fail Net signal is set on the cycle immediately following the CFD signal. The Fail Net signal suspends testing of the memory under test until a TII interface signal is asserted from the ATE tester to indicate that testing is to resume.

When Fail Net is asserted, the BIST clock control logic automatically changes Clock Net from the Multiplied CLK to the Tester CLK. Any number of tester clock cycles can pass without updating the memory under test until the TII interface signal is asserted.

After a TII signal is asserted from the ATE tester, the Shift Net signal is asserted enabling the ATE tester clock to shift out the location of the failing data.

After the FM registers 11 are shifted out using the ATE tester clock, the TII signal is deasserted from the ATE tester, which resets the Fail Net latch to 0 and resets the Shift Net signal to 0, and testing is then resumed with the Multiplied CLK.

The BIST clock control logic automatically switches back from the Tester CLK to the Multiplied CLK, and the macro test resumes exactly where it left off when the Fail Net signal previously suspended the BIST.

Figure 8:
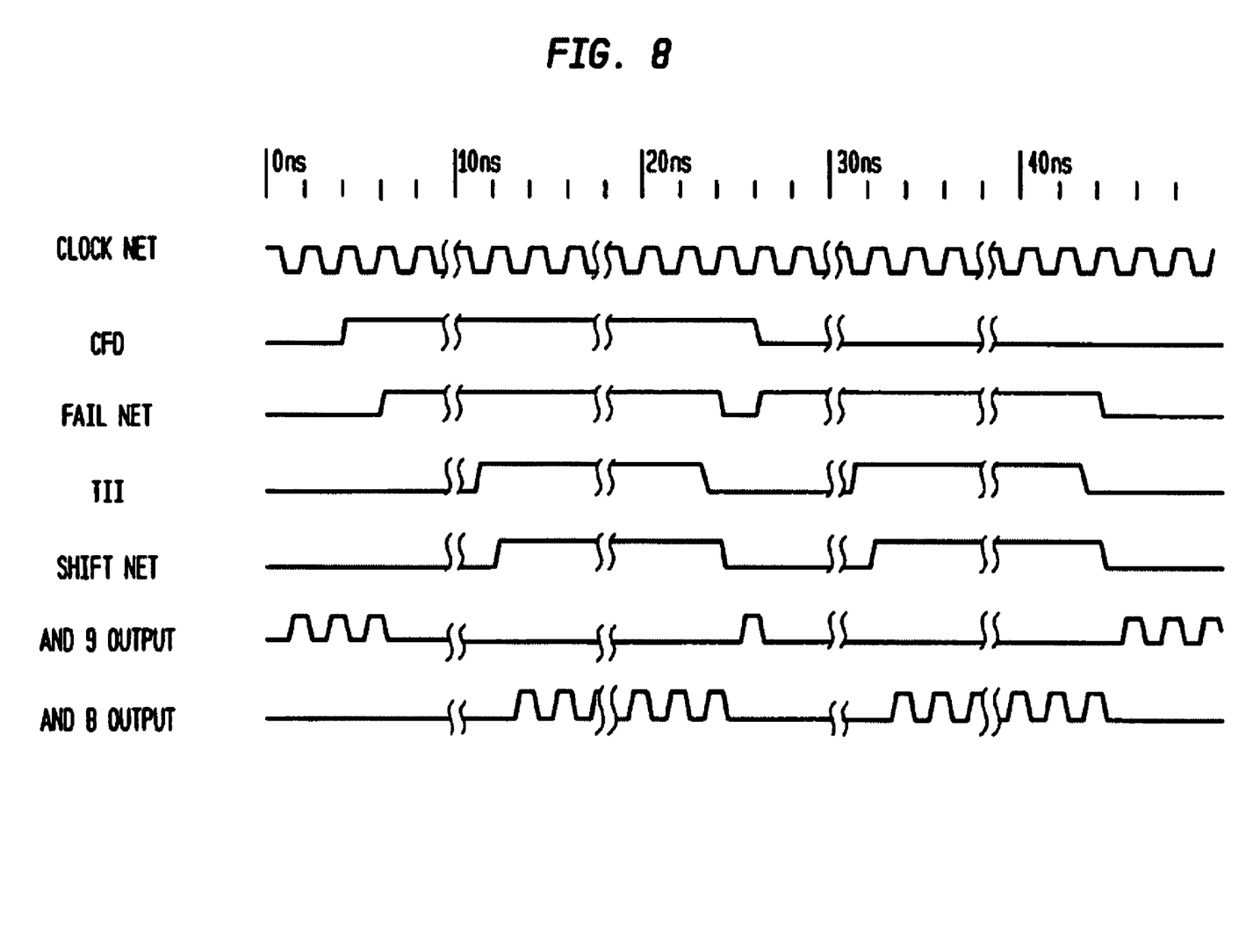
FIG. 8 illustrates waveforms that describe the operation of the Fail Map circuit with consecutive fails.

FIG. 8 illustrates waveforms that describe the operation of the Fail Map circuit with consecutive fails.

The CFD signal fires when the data from the array is not equal to the expected data generated by the BIST.

The Fail Net signal is set on the cycle immediately following the CFD signal. The Fail Net signal suspends testing of the memory under test until a TII interface signal is asserted from the ATE tester to indicate that testing is to resume.

When Fail Net is asserted, the BIST clock control logic automatically changes Clock Net from the Multiplied CLK to the Tester CLK. Any number of tester clock cycles can pass without updating the memory under test until the TII interface signal is asserted.

After a TII signal is asserted from the ATE tester, the Shift Net signal is asserted enabling the ATE tester clock to shift out the location of the failing data After the FM registers 11 are shifted out using the ATE tester clock, the TII signal is deasserted from the ATE tester, which resets the Fail Net latch to 0 and resets the Shift Net signal to 0, and testing is then resumed with the Multiplied CLK.

The BIST clock control logic switches from the tester CLK back to the multiplied CLK and the macro test resumes, for one cycle, exactly from where it left off since the CFD signal has remained high because of the second consecutive fail.

The output of AND gate 9 latches in the second CFD signal, asserting the Fail Net signal. Since the CFD signal is low again, this portion of the diagram/explanation is identical to the diagram/explanation of a single fail.

If multiple shift-outs are necessary, the retention of the DRAM cell may force the test to be re-run from the beginning but while ignoring the first few shift outs. The logic in the macro will always force the BIST and DRAM to stop updating, but the time consuming process of shifting out the bit fail map data can be minimized as described below.

Figure 9:
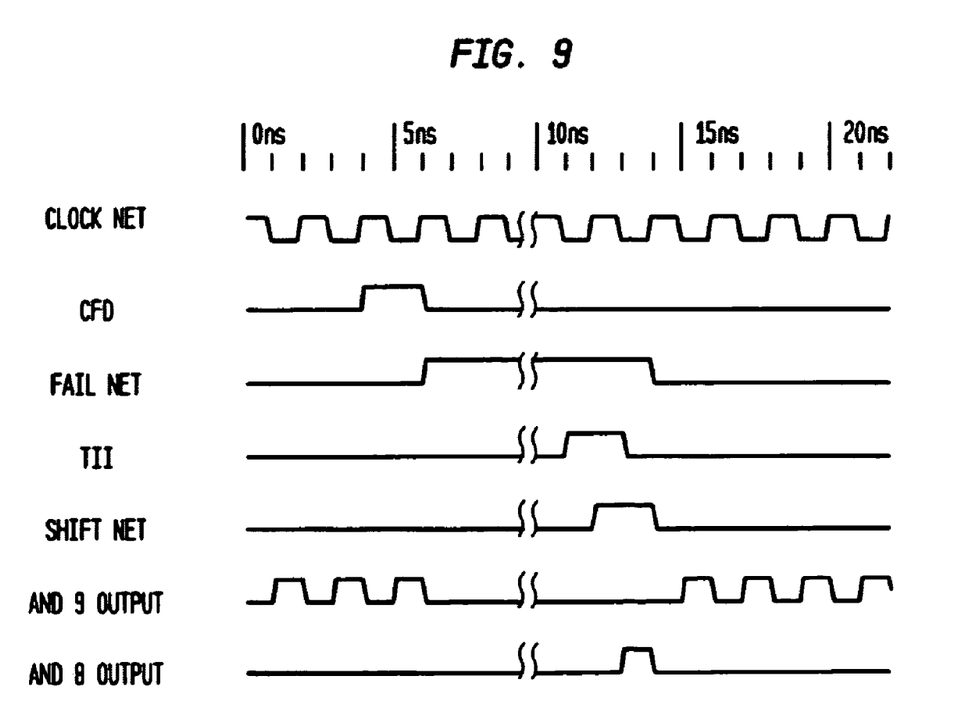
FIG. 9 illustrates waveforms for the situation wherein if a bit fail map shift out sequence is not desired, a single continue pulse held high for one tester CLK will cause the BIST to resume the test without collecting fail map data.

FIG. 9 illustrates waveforms for the situation wherein if a bit fail map shift out sequence is not desired, a single continue pulse held high for one tester CLK will cause the BIST to resume the test without collecting fail map data.

The CFD signal fires when the data from the array is not equal to the expected data generated by the BIST.

The Fail Net signal is set on the cycle immediately following the CFD signal. The Fail Net signal suspends testing of the memory under test until a TII interface signal is asserted from the ATE tester to indicate that testing is to resume.

When Fail Net is asserted, the BIST clock control logic automatically changes Clock Net from the Multiplied CLK to the Tester CLK. Any number of tester clock cycles can pass without updating the memory under test until the TII interface signal is asserted.

A TII signal is asserted and then deasserted over one clock cycle.

The CLK signal latches the TII signal rising and falling, enabling the Shift Net signal to rise and reset Latch 1 when TII falls.

A single Shift Net pulse results, but this data is ignored by the tester and it does not upset any latch states in the macro.

The TII signal is deasserted, causing the Fail Net signal and the Shift Net signal to fall, enabling the BIST to switch back to the multiplied CLK and enabling the test to resume where it left off when the Fail Net signal previously stopped the BIST.

The present invention provides accurate bit fail mapping when the memory under test is running on a clock that is an out of phase/multiplied version of the ATE tester clock. The circuit and methodology provide for high speed bit fail mapping with little or no interaction from the ATE tester.

While several embodiments and variations of the present invention for automatic bit fail mapping for embedded memories with clock multipliers are described in detail herein, it should be apparent that the disclosure and teachings of the present invention will suggest many alternative designs to those skilled in the art.

The invention claimed is:

1. A method for implementing at speed bit fail mapping of an embedded memory system having a BIST (Built In Self Testing) engine, comprising:

using a high speed multiplied clock which is an asynchronous multiple of a slower external clock of a tester to sequence BIST bit fail testing of the embedded memory system, said BIST generating a fail map data including all diagnostic fails for capture by a diagnostic register device under control of said high speed multiplied clock, the diagnostic fail data being stored in fail location latches of said diagnostic register device at a time of recognizing said BIST fail test;

generating a signal for receipt by said tester to identify a BIST bit fail test for said tester, and;

in response to said generated signal, implementing a BIST clock control logic for automatically pausing the BIST bit fail testing upon recognition of a fail of the embedded memory system, said BIST clock control logic gating off said high speed multiplied clock to BIST test latches and fail location latches of said diagnostic register;

receiving, from said tester, a first signal asserted in response to receiving said generated signal;

said BIST clock control logic automatically switching, in response to said received asserted first signal, said diagnostic register device to operate from a data capture mode controlled by the high speed multiplied clock to a serial transfer mode controlled by the slower external clock of the tester;

using the slower external clock of the tester to read bit fail data out from said fail location latches of said diagnostic register device to the tester; and, receiving, from said tester, a de-asserted first signal when all fail data out from said fail location latches of said diagnostic register device are read;

automatically switching, in response to said received de-asserted first signal, said BIST clock control logic to resume data capture at said fail location latches of said diagnostic register device at said high speed multiplied clock; and, resuming the BIST testing with the high speed multiplied clock from the point at which it was paused, wherein diagnostic bit fail data is extracted from said diagnostic register device without disturbing a state of said BIST or said embedded memory.

2. The method of claim 1, used for bit fail mapping of an embedded DRAM (Dynamic Random Access Memory).

3. The method of claim 2, including using an on-chip clock multiplier to multiply the external clock to generate the high speed multiplied clock.

4. The method of claim 3, including using the on-chip clock multiplier to multiply the external clock of an off-chip ATE (Automatic Test Equipment) tester to generate the high speed multiplied clock.

5. The method of claim 4, wherein said BIST clock control logic includes a multiplexer having a first input from the tester clock and a second input from the high speed multiplied clock, and the BIST clock control logic causes the multiplexer to pass either the first input from the tester clock for reading said read bit fail data out from said fail location latches of said diagnostic register device or the second input from the high speed multiplied clock during data capture.

6. The method of claim 1, wherein new fail map data is captured on every high speed multiplied clock cycle.

7. A circuit for implementing at speed bit fail mapping of an embedded memory system having a BIST (Built In Self Testing) engine on a chip, comprising:
an off-chip tester having a tester clock;
the BIST engine using a high speed multiplied clock which is an asynchronous multiple of the tester clock to sequence the BIST engine for bit fail testing of the embedded memory system, said BIST engine generating a fail map data for capture at fail location latches of a diagnostic register device, the diagnostic fail data being stored in fail location latches at a time of recognizing said BIST fail test, and generating a signal for receipt by said off-chip tester to identify a BIST bit fail test for said tester;
the circuit including BIST clock control logic, responsive to said generated signal, for pausing the BIST testing upon recognition of a fail of the embedded memory system, said BIST clock control logic gating off said high speed multiplied clock to BIST test latches and fail location latches of said diagnostic register;
said off-chip tester asserting, for receipt by said circuit, a first signal in response to receiving said generated signal;
said BIST clock control logic for automatically switching, in response to said received asserted first signal, said diagnostic register device to operate from a data capture mode controlled by the high speed multiplied clock to a serial transfer mode controlled by the tester clock,
the circuit using the tester clock to read bit fail data out to the tester from said fail location latches of said diagnostic register device, and,
said off-chip tester de-asserting said first signal for receipt by said BIST clock control logic when all fail data out from said fail location latches of said diagnostic register device are read; and
said circuit, in response to said received de-asserted first signal, to resume data capture at said fail location latches of said diagnostic register device at said high speed multiplied clock from the point at which BIST testing was paused, wherein diagnostic bit fail data is extracted from said diagnostic register device without disturbing a state of said BIST or said embedded memory.

8. The circuit of claim 7, for automatic bit fail mapping of an embedded DRAM (Dynamic Random Access Memory), including an on-chip clock multiplier for multiplying the tester clock of an off-chip ATE (Automatic Test Equipment) tester to produce the high speed multiplied clock, wherein the logic pauses the BIST engine at a point when a mismatch between BIST expected data and the actual data read from the DRAM is encountered, then shifts the bit fail data off the chip using the low-speed ATE tester clock, and then resumes the BIST engine using the high speed multiplied clock to provide an at speed bit fail map.

9. The circuit of claim 8, further comprising a multiplexer having a first input from the tester clock and a second input from the high speed multiplied clock, and the logic causes the multiplexer to pass either the first input from the tester clock or the second input from the high speed multiplied clock to the BIST engine.

10. The circuit of claim 7, wherein new fail map data is captured on every high speed multiplied clock cycle.

11. A circuit for enabling at speed bit fail mapping of an embedded Dynamic Random Access Memory (DRAM) system, the circuit comprising:
a bit fail map data register having diagnostic latches used to store data on failing memory locations for the generation of a bit fail map in a data capture mode controlled by a high speed multiplied clock which is an asynchronous multiple of a slower tester clock, an on-chip clock multiplier provided for multiplying said slower tester clock of an off-chip ATE (Automatic Test Equipment) tester to produce said high speed multiplied clock;
a first control latch that asserts a pause signal upon receiving a fail data signal indicating a mismatch comparison between expected data from the embedded memory system and actual data read from the embedded memory system, the bit fail map data being stored in said diagnostic latches at a time of recognizing a BIST bit fail test;
a second control latch that is set upon receiving the pause signal from the first control latch and asserts a shift enable signal to enable a shift out of the data on failing memory locations from the bit fail map data register in a serial transfer mode controlled by the slower tester clock for the generation of a bit fail map, and,
logic which includes the first and second control latches operable to pause a BIST (Built In Self Testing) engine at a point when a mismatch between BIST expected data and the actual data read from the DRAM is encountered, said logic causing said shifting out the bit fail data off the bit fail map data register using the slower ATE tester clock, and then resuming the BIST engine using the high speed multiplied clock to provide an at speed bit fail map,
said pause signal of the first control latch pausing BIST engine test circuitry for testing the embedded memory system and enabling a continue/handshake signal from said off-chip ATE to enable the second control latch to assert the shift enable signal to enable a shift out of the data on failing memory locations from the bit fail map data register for the generation of a bit fail map,
wherein the bit fail map data register includes fail location latches for storing the location of the fail upon recognition of the fail, and the logic that pauses the BIST engine also de-gates the slower ATE tester clock to the fail location registers, allowing the bit fail data to be shifted off the chip to the ATE tester at the slower ATE tester clock speed,
wherein the first and second control latches include both master latches, which are clocked with function data with a function clock or with scan data with a scan clock, and slave latches which are updated with master latch data with a slave latch clock,
wherein diagnostic bit fail data is extracted from said diagnostic register device without disturbing a state of said BIST or said embedded memory.

12. The circuit of claim 11, further comprising a multiplexer having a first input from the tester clock and a second input from the high speed multiplied clock, and the logic causes the multiplexer to pass either the first input from the tester clock or the second input from the high speed multiplied clock to the BIST engine.

* * * * *